US008653560B2

(12) United States Patent
Tatsumura et al.

(10) Patent No.: US 8,653,560 B2
(45) Date of Patent: Feb. 18, 2014

(54) SEMICONDUCTOR DEVICE AND FABRICATION METHOD THEREOF

(75) Inventors: Kosuke Tatsumura, Kawasaki (JP); Atsuhiro Kinoshita, Kamakura (JP)

(73) Assignee: Kabushiki Kaisha Toshiba, Minato-ku, Tokyo (JP)

( * ) Notice: Subject to any disclaimer, the term of this patent is extended or adjusted under 35 U.S.C. 154(b) by 99 days.

(21) Appl. No.: 13/344,107

(22) Filed: Jan. 5, 2012

(65) Prior Publication Data
US 2012/0139007 A1   Jun. 7, 2012

Related U.S. Application Data

(63) Continuation of application No. PCT/JP2009/062463, filed on Jul. 8, 2009.

(51) Int. Cl.
*H01L 29/66* (2006.01)

(52) U.S. Cl.
USPC ............. 257/192; 257/E21.409; 257/E29.255

(58) Field of Classification Search
USPC ............ 257/192, E21.409, E29.255; 438/198
See application file for complete search history.

(56) References Cited

U.S. PATENT DOCUMENTS

| | | | | |
|---|---|---|---|---|
| 5,336,904 | A * | 8/1994 | Kusunoki | 257/23 |
| 6,476,462 | B2 * | 11/2002 | Shimizu et al. | 257/627 |
| 6,730,987 | B2 * | 5/2004 | Udagawa | 257/615 |
| 7,045,407 | B2 * | 5/2006 | Keating et al. | 438/198 |
| 7,091,078 | B2 * | 8/2006 | Laux | 438/198 |
| 7,547,637 | B2 * | 6/2009 | Brask et al. | 438/717 |
| 7,898,003 | B2 * | 3/2011 | Cheng et al. | 257/192 |
| 8,013,396 | B2 * | 9/2011 | Ono | 257/368 |
| 8,039,877 | B2 * | 10/2011 | Ngai et al. | 257/255 |
| 8,071,983 | B2 * | 12/2011 | Brask et al. | 257/66 |
| 8,212,336 | B2 * | 7/2012 | Goebel et al. | 257/627 |
| 2005/0227425 | A1 * | 10/2005 | Henley | 438/198 |

(Continued)

FOREIGN PATENT DOCUMENTS

| | | |
|---|---|---|
| JP | 2000-0012838 A | 1/2000 |
| JP | 2004-327926 A | 11/2004 |
| JP | 2007-509503 A | 4/2007 |
| JP | 2008-160131 A | 7/2008 |

OTHER PUBLICATIONS

English translation of IPRP dated Feb. 23, 2012 from PCT/JP2009/062463; 5 pages.

(Continued)

*Primary Examiner* — David Vu
*Assistant Examiner* — Caleb Henry
(74) *Attorney, Agent, or Firm* — Ohlandt, Greeley, Ruggiero & Perle, L.L.P.

(57) ABSTRACT

According to one embodiment, a fabrication method of a semiconductor device comprising forming a dummy gate with a gate length direction set to a [111] direction perpendicular to a [110] direction on a surface of a supporting substrate having $Si_{1-x}Ge_x$ ($0 \leq x < 0.5$) with a crystal orientation perpendicular to the surface set to the [110] direction on the surface, forming source/drain regions and forming insulating films on side portions of the dummy gate. Next, the dummy gate is etched with using the insulating films as a mask, and a surface portion of the substrate between the source/drain regions is further etched. Next, a channel region formed of a III-V group semiconductor or Ge is grown between the source/drain regions by using the edge portions of the source/drain regions as seeds. Then, a gate electrode is formed above the channel region via a gate insulating film.

3 Claims, 13 Drawing Sheets

(56) References Cited

U.S. PATENT DOCUMENTS

| | | |
|---|---|---|
| 2006/0084207 A1* | 4/2006 | White et al. .................. 438/184 |
| 2007/0228485 A1* | 10/2007 | Tsuchiya et al. .............. 257/371 |
| 2007/0228486 A1* | 10/2007 | Tsuchiya et al. .............. 257/371 |
| 2007/0267722 A1* | 11/2007 | Lochtefeld et al. ........... 257/618 |
| 2007/0278585 A1* | 12/2007 | Dyer et al. .................... 257/369 |
| 2007/0298558 A1* | 12/2007 | Yamauchi et al. ............ 438/197 |
| 2008/0113476 A1* | 5/2008 | Anderson et al. ............. 438/198 |
| 2008/0153220 A1* | 6/2008 | Henley .......................... 438/198 |
| 2008/0224216 A1* | 9/2008 | Cheng et al. .................. 257/348 |
| 2008/0227241 A1* | 9/2008 | Nakabayashi et al. ........ 438/150 |
| 2008/0286917 A1* | 11/2008 | Fogel et al. ................... 438/198 |
| 2009/0050972 A1* | 2/2009 | Lindsay et al. ............... 257/368 |
| 2009/0065816 A1* | 3/2009 | Cunningham et al. ........ 257/255 |
| 2009/0072276 A1* | 3/2009 | Inaba ............................. 257/255 |
| 2009/0095987 A1* | 4/2009 | Rost ............................... 257/255 |
| 2009/0159932 A1* | 6/2009 | Pinto et al. .................... 257/255 |
| 2009/0159933 A1* | 6/2009 | Pinto et al. .................... 257/255 |
| 2009/0173967 A1* | 7/2009 | Hamaguchi et al. .......... 257/190 |
| 2009/0280612 A1* | 11/2009 | Shimamune et al. ......... 438/300 |
| 2009/0283806 A1* | 11/2009 | Yang et al. .................... 257/288 |
| 2009/0289280 A1* | 11/2009 | Zhang et al. .................. 257/190 |
| 2009/0291537 A1* | 11/2009 | Yamaguchi et al. .......... 438/198 |
| 2009/0302349 A1* | 12/2009 | Lee et al. ...................... 257/192 |
| 2009/0302399 A1* | 12/2009 | Cartier et al. ................. 257/407 |
| 2009/0305471 A1* | 12/2009 | Chang et al. .................. 438/154 |
| 2010/0065887 A1* | 3/2010 | Goebel et al. ................ 257/192 |
| 2010/0078689 A1* | 4/2010 | Kronholz et al. ............. 257/288 |
| 2010/0129971 A1* | 5/2010 | Ohta et al. .................... 438/230 |
| 2010/0148153 A1* | 6/2010 | Hudait et al. .................. 257/24 |
| 2010/0224935 A1* | 9/2010 | Ono ............................... 257/368 |

OTHER PUBLICATIONS

Hoshii, et al., "Formation of InGaAs-On-Insulator Structures by Epitaxial Lateral Over Growth from (111) Si"; Extended Abstracts of the 2007 International Conference on Solid State Devices and Materials, Tsukuba, 2007, pp. 132-133.

Hiruta, et al., "Evolution of Surface Morphology of Si-trench Sidewalls During Hydrogen Annealing"; Applied Surface Science, 237, 2004, pp. 63-67.

Deura, et al., "Effect of Ga content on Crystal Shape in Microchannel Selective-area MOVPE of InGaAs on Si"; Journal of Crystal Growth, 310, 2008, pp. 4768-4771.

International Search Report dated Sep. 15, 2009 from corresponding PCT/JP2009/062463.

* cited by examiner

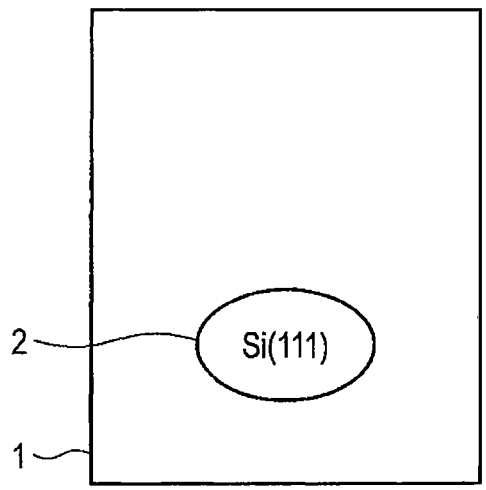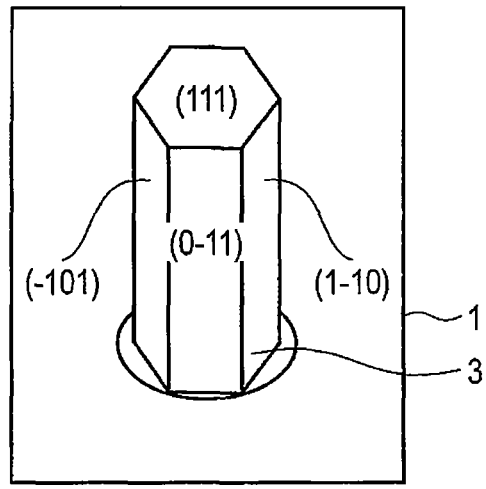
F I G. 1A  F I G. 1B

FIG. 3

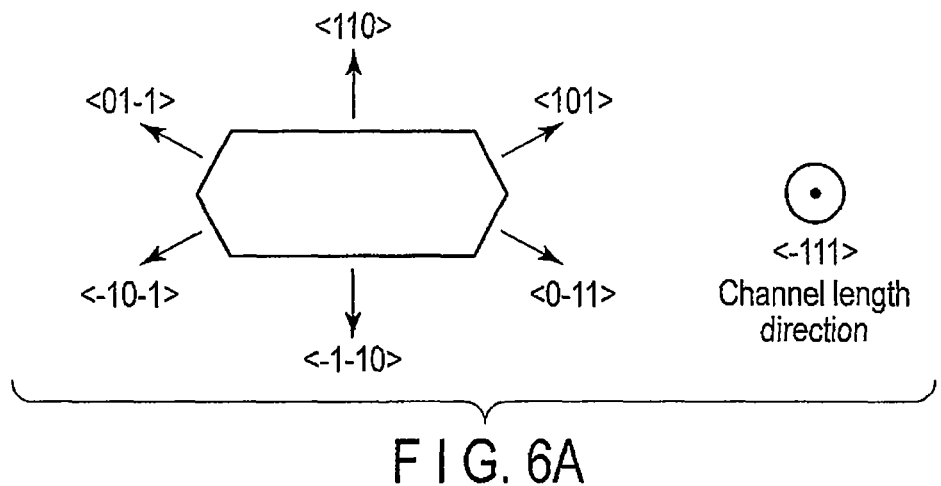
F I G. 6A
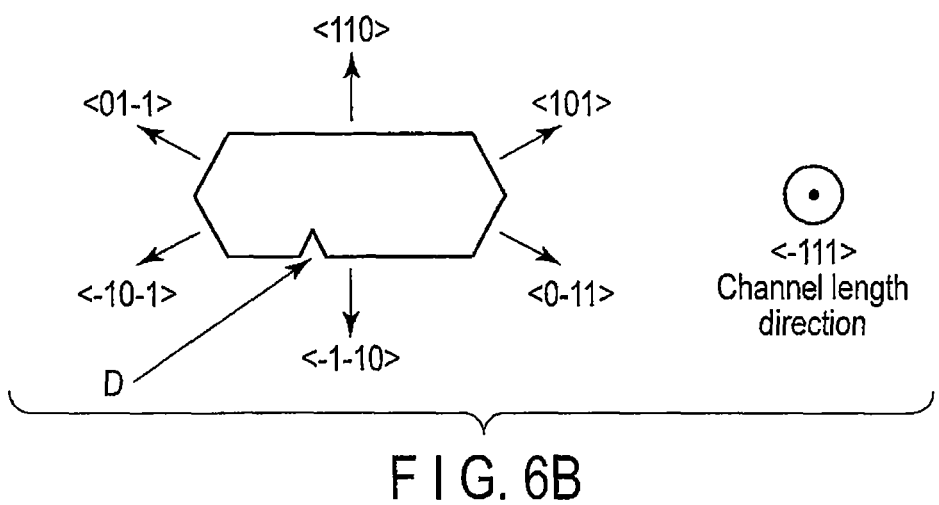
F I G. 6B
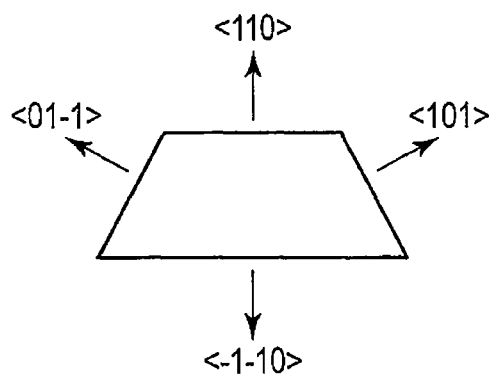
F I G. 6C

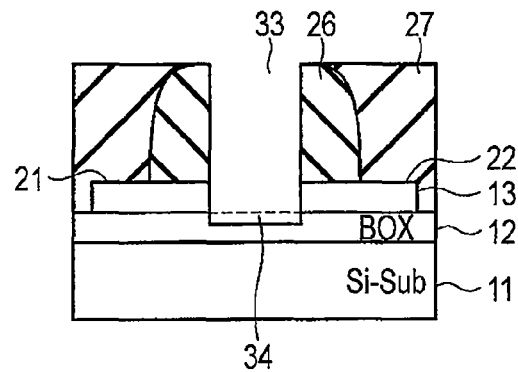
FIG. 8A
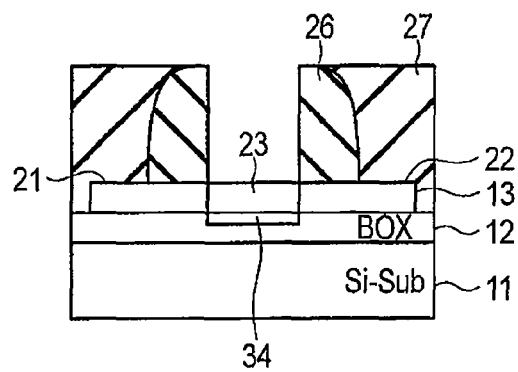
FIG. 8B
| (Plane)/<in-plane channel direction> | $m_{CE}$ | Conductivity $\propto 1/m_{CE}$ |
|---|---|---|
| (110)/<111> | 0.225 | 116% |
| (110)/<001> | 0.234 | 111% |
| (110)/<110> | 0.260 | 100% |
FIG. 9

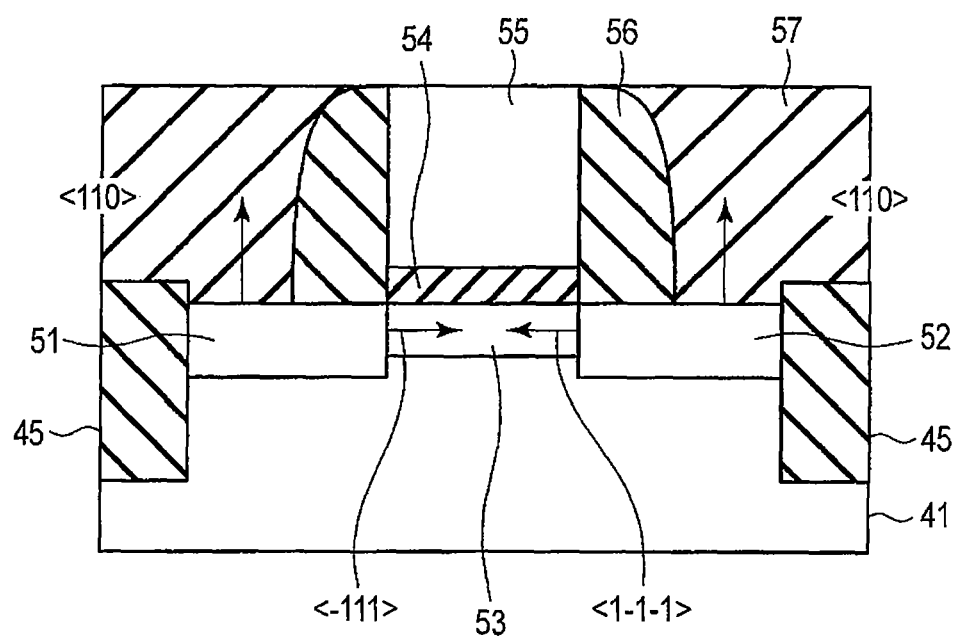
F I G. 10

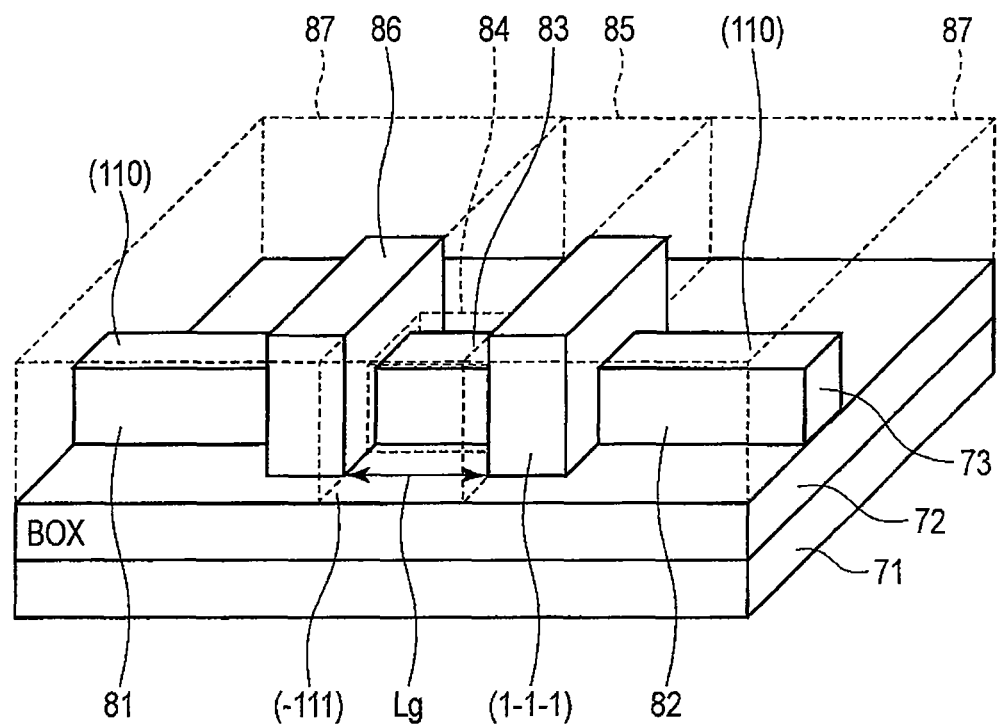
F I G. 12

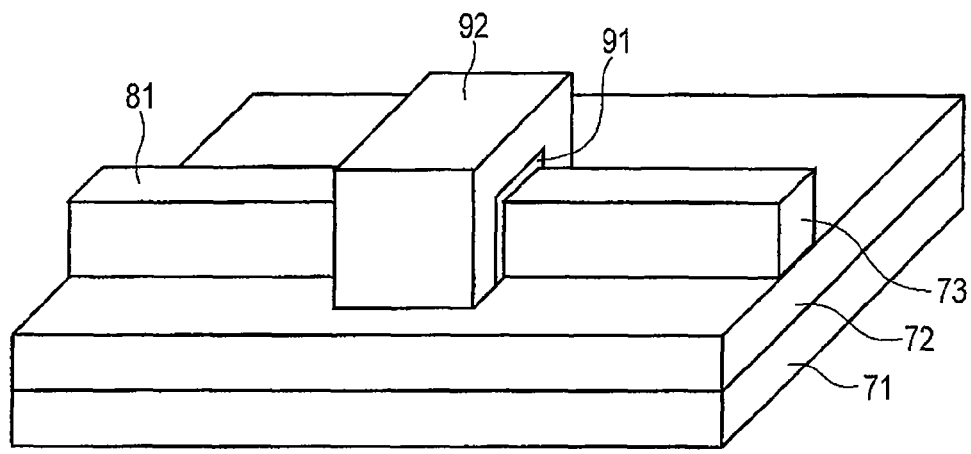
F I G. 13A
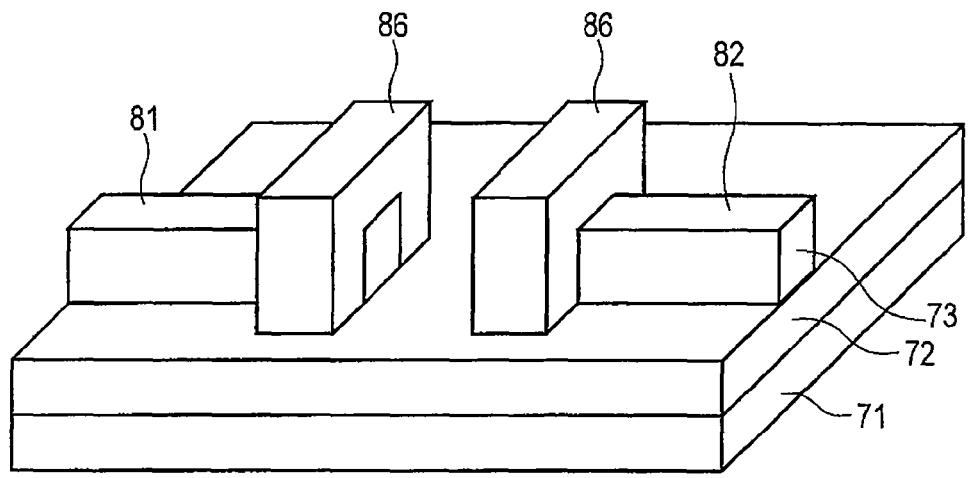
F I G. 13B
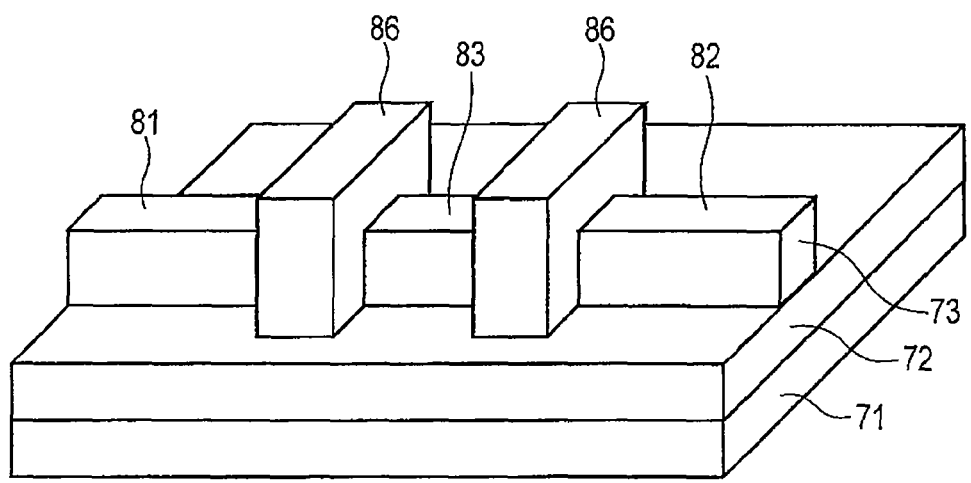
F I G. 13C

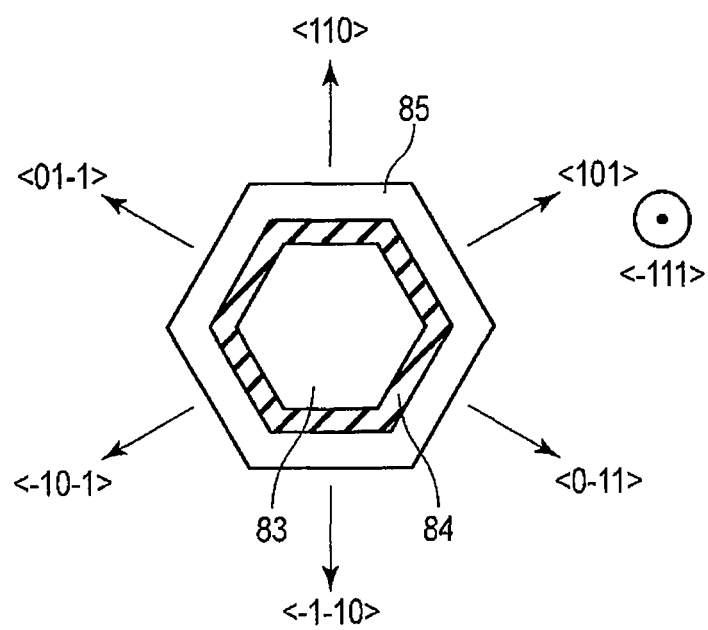
F I G. 14

US 8,653,560 B2

SEMICONDUCTOR DEVICE AND FABRICATION METHOD THEREOF

CROSS REFERENCE TO RELATED APPLICATIONS

This application is a Continuation Application of PCT Application No. PCT/JP2009/062463, filed Jul. 8, 2009, the entire contents of which are incorporated herein by reference.

FIELD

Embodiments described herein relate generally to a semiconductor device using a high-mobility channel material in a channel region of a metal insulator semiconductor (MIS) FET and a fabrication method thereof.

BACKGROUND

In recent years, the performance enhancement of the silicon semiconductor device due to miniaturization tends to slow down. Due to this tendency, a high-mobility channel material MISFET using a IV group material including Ge or a III-V group material having higher carrier mobility than Si as a channel material is studied. In order to put this to practical use, it is necessary to establish a method for forming high-mobility channel material MISFETs with high density on a substrate including Si as a main component.

There is a method consisting of the etching step of a SiO$_2$ layer formed on a Si substrate to open a Si seed portion for subsequent crystal growth and lateral growth step of a III-V group semiconductor from the seed portion toward a region covered with the SiO$_2$ layer (Document 1: T. Hoshii, et al., Extended Abstracts of the 2007 International Conference on Solid State Devices and Materials, Tsukuba, 2007, pp. 132-133). However, with this method, the seed portion creates an area penalty to cause a problem that the integration density of the high-mobility channel material MISFETs is lowered.

Further, the structure utilizing a III-V group material in a channel region and utilizing SiGe in source/drain regions is proposed (Document 2: JP-A 2008-160131 (KOKAI)). However, in Doc. 2, the structure and method for high-density formation of high-mobility channel material MISFETs on a substrate are not disclosed at all.

Further, a MISFET having source/drain regions formed of silicon including impurities and having a channel region formed of a semiconductor material having a wider energy band gap than Si is proposed (Document 3: JP-A 2000-012838 (KOKAI)). However, in Document 3, a method for forming different types of semiconductor materials on a Si substrate with high crystallinity, a high degree of crystal orientation and a high degree of flatness is not disclosed at all.

BRIEF DESCRIPTION OF THE DRAWINGS

FIGS. 1A, 1B are views for explaining the first basic technique.

FIG. 3 is a diagram showing the relationship between [110] direction and [111] directions perpendicular to the [110] direction and the relationship between {110} crystal plane and {111} directions perpendicular to the {110} plane.

FIGS. 6A to 6C are cross-sectional views perpendicular to the channel length direction of a channel region in the MISFET of FIG. 4.

FIGS. 8A, 8B are cross-sectional views showing an example in which a BOX layer is etched prior to growth of a III-V group material.

FIG. 9 is a diagram showing the relationship between the channel length direction and conductivity in a Si (110) plane.

FIG. 10 is a cross-sectional view showing the structure of a MISFET according to the third embodiment.

FIG. 12 is a perspective view showing the structure of a MISFET according to the fourth embodiment.

FIGS. 13A to 13C are perspective views showing fabrication steps of the MISFET according to the fourth embodiment.

FIG. 14 is a cross-sectional view indicating a modification of the fourth embodiment and showing a channel region.

DETAILED DESCRIPTION

In general, according to one embodiment, there is provided a fabrication method of a semiconductor device comprising forming a dummy gate with a gate length direction set to a [111] direction perpendicular to a [110] direction on a surface of a supporting substrate having Si$_{1-x}$Ge$_x$ (0≤x<0.5) with a crystal orientation perpendicular to the surface set to the direction on the surface, forming source/drain regions on the surface of the substrate with using the [110] dummy gate as a mask and forming insulating films on side portions of the dummy gate after formation of the source/drain regions. Next, the dummy gate is etched with using the insulating films as a mask, and a surface portion of the substrate between the source/drain regions is further etched to expose edge portions of the source/drain regions. Next, a channel region formed of a III-V group semiconductor or Ge is grown between the source/drain regions by using edge portions of the source/drain regions as seeds. Then, a gate electrode is formed above the channel region via a gate insulating film.

Prior to the explanation for embodiments, the background technology used is explained.

(Background Technology 1)

A III-V semiconductor can be grown selectively on an opening portion of an insulating film (in other words, Si exposed portion) of a Si (111) plane covered with an insulating film, with a preferential growth direction of a <111> direction. FIGS. 1A, 1B schematically show this example. As shown in FIG. 1A, a SiO$_2$ opening region 2 is formed in a desired location of a Si (111) surface covered with a SiO$_2$ film 1 as an insulating film. If an III-V group semiconductor is grown by Chemical Vapor Deposition (CVD) with respect to the structure of FIG. 1A, a structure of a III-V group semiconductor 3 with a hexagonal column shape whose upper surface is a (111) plane and whose side surfaces are (0-11), (01-1), (1-10), (-110), (-101), (10-1) planes can be formed selectively on the SiO$_2$ opening region 2 as shown in FIG. 1B.

This is because a zincblende-type crystal including a III-V group semiconductor or a diamond-type crystal including Ge has a feature that it tends to grow with a preferential growth direction of a [111] direction and a feature that the 11101 plane is a stable surface whose surface energy is relatively low. This example is reported in, for example, Document 4 (M. Deura, et. al., Journal of Crystal Growth 310, p 4768 (2008)).

(Background Technology 2)

Figures 2A, 2B:
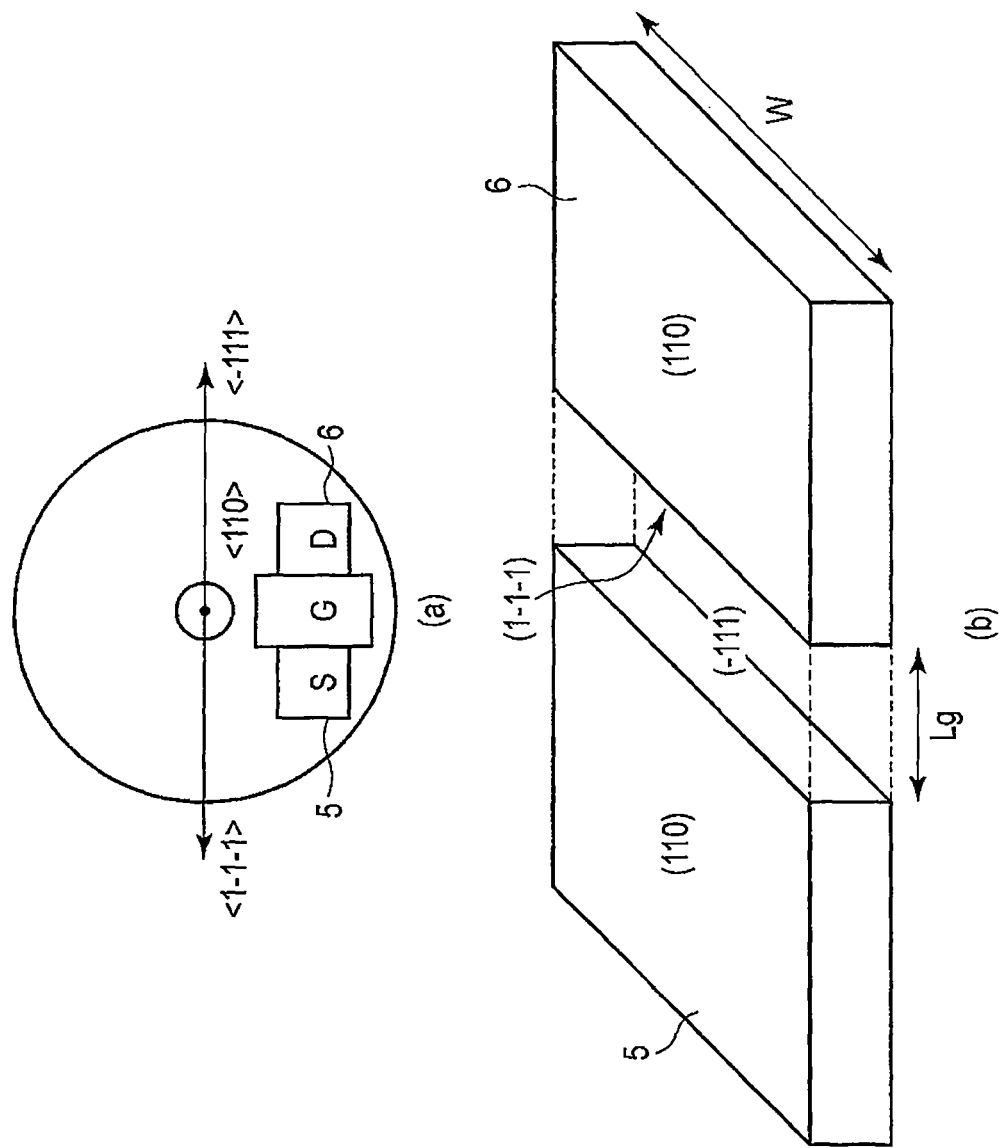
FIGS. 2A, 2B are views for explaining the second basic technique.

In this specification, a specific crystal direction is notated by <hkl> and the crystal direction equivalent thereto is generally notated by [hkl]. Likewise, a specific crystal plane is notated by (hkl) and the plane equivalent thereto is generally notated by {hkl}. The (hkl) plane and <hkl> direction are in a relationship in which the direction perpendicular to the (hkl) plane is the <hkl> direction. The (110) plane and the (−111) plane, or the (110) plane and the (1-1-1) plane are in a vertical relationship. Therefore, in the case of a (110) substrate, a concave portion with side surfaces of the (−111) plane and (1-1-1) plane which are perpendicular to the surface can be formed. FIGS. 2A, 2B schematically show this. In FIGS. 2A, 2B, 5 denotes a source region, 6 a drain region, Lg channel length (gate length), W channel width (gate width).

As shown in FIG. 2A, it is supposed that a MISFET is arranged on a (110) substrate with the channel length direction (a direction connecting the source region 5 to the drain region 6) set to a <−111> direction. Then, if the channel portion is vertically etched, exposed side surfaces of the source region 5 and drain region 6 are respectively set to a (−111) plane and (1-1-1) plane as shown in FIG. 2B. On the other hand, in the case of a (001) substrate or (111) substrate that is the main low index plane, the surface and the {111} plane are not in the vertical relationship.

Figure 3:
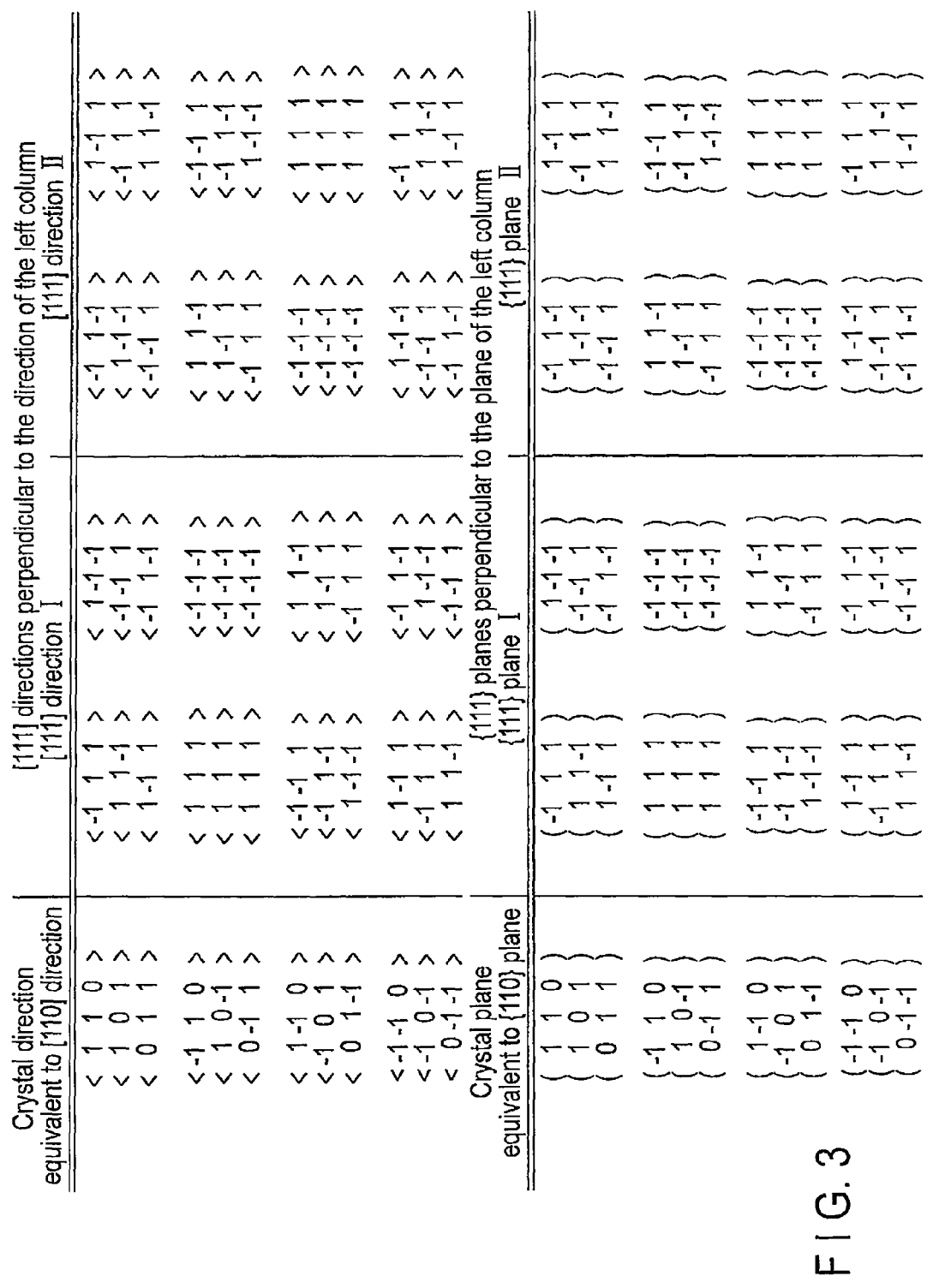

In FIG. 2B, a case where the upper surface is set to the (110) plane and the side surfaces are set to the (−111) plane and (1-1-1) plane is given, but the scope of this embodiment is not limited to the specified crystal plane and includes a case of a combination of a crystal plane equivalent thereto. As shown in FIG. 3, the number of crystal planes equivalent to the (110) plane is 12 in total including the (110) plane. Further, if one of them is set as a surface, two sets of pairs of the {111} planes perpendicular to the surface and facing each other are provided. Therefore, if one of the {110} planes is selected as the substrate upper surface, the plane orientation of the side surfaces of the source/drain regions may be set to the pair of the {111} planes that is perpendicular to the selected (110) plane. In this specification, described hereinafter is a case where the upper surface of the (110) plane and the side surfaces of the (−111) plane and (1-1-1) plane are set as representatives among combinations of equivalent crystal planes.

Next, the details of this embodiment are explained with reference to the drawings.

(First Embodiment)

Figure 4:
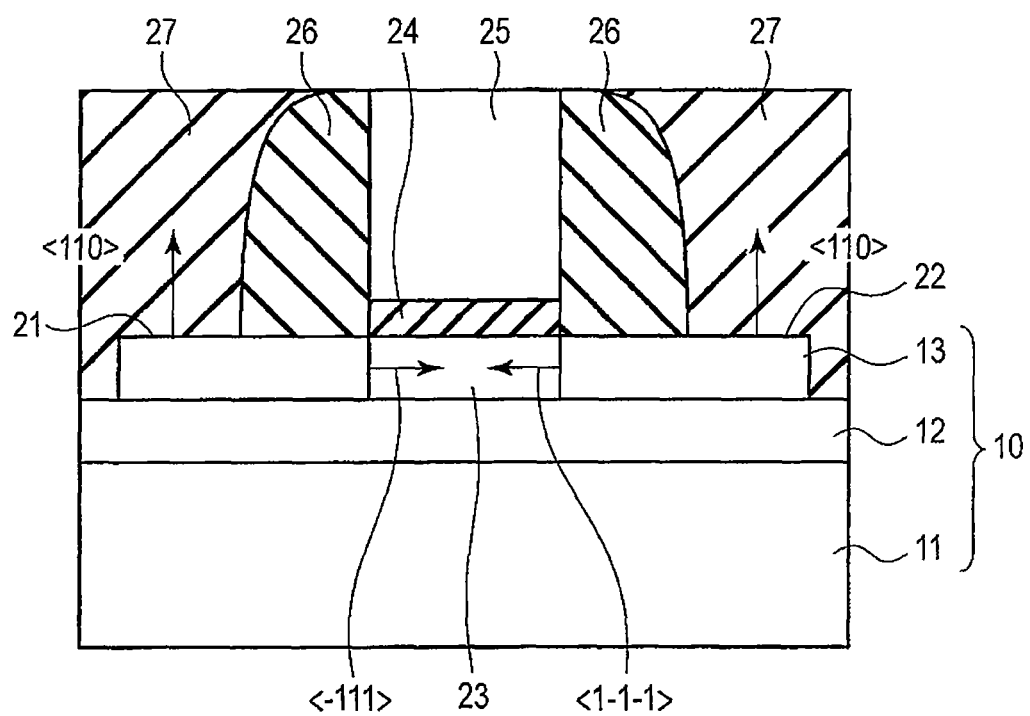
FIG. 4 is a cross-sectional view showing the structure of a MISFET according to the first embodiment.

FIG. 4 is a cross-sectional view showing the structure of a MISFET according to the first embodiment and, particularly, shows the cross section along the channel length direction.

In this embodiment, an SOI substrate 10 obtained by forming a buried insulating layer (BOX: Buried OXide layer) 12 on a Si substrate 11 and forming a Si layer (SOI layer) 13 thereon is used as a supporting substrate. Then, on the SOI substrate 10, a MISFET including a source region 21, drain region 22, channel region 23, gate insulating film 24 and gate electrode 25 is formed.

The source/drain regions 21, 22 are formed of the Si layer 13 and the crystal orientation in the vertical direction to the substrate surface thereof is <110>. The channel region 23 sandwiched by the source/drain regions 21, 22 is formed of a III-V group semiconductor material. A direction perpendicular to the interface between the source region 21 and the channel region 23 is <−111> and a direction perpendicular to the interface between the drain region 22 and the channel region 23 is <1-1-1>. Sidewall insulating films 26 are formed on the side surfaces of a gate stack formed by combining the gate insulating film 24 with the gate electrode 25. Further, the substrate surface on which the above portions are formed is covered with an interlayer insulating film 27 and the surface of the interlayer insulating film 27 is flattened. Then, the surface of the interlayer insulating film 27 is set at the same height as the surface of the gate electrode 25.

Next, a fabrication method of the MISFET of the present embodiment is explained with reference to FIGS. 5A to 5F.

Figure 5A:
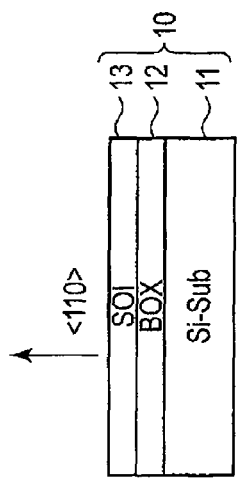
FIGS. 5A to 5F are cross-sectional views showing fabrication steps of the MISFET according to the first embodiment.
Figure 5B:
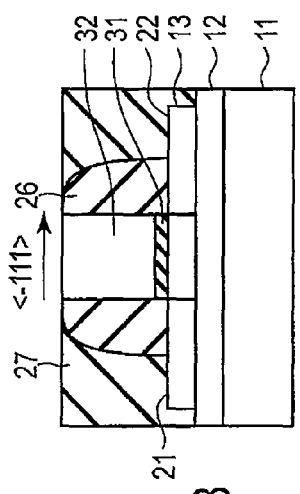

First, as shown in FIG. 5A, an SOI substrate (supporting substrate) 10 having a Si layer 13 whose upper surface is a (110) plane is prepared. Next, as shown in FIG. 5B, a MISFET is formed by a conventional so-called gate-first process with the channel length direction set to the <−111> direction.

Specifically, only active regions finally used as the source/drain regions and channel region are left behind and the other region is etched by performing a mesa-type element isolation step with respect to the Si layer 13. Subsequently, after a dummy gate insulating film 31 and dummy gate electrode 32 are deposited on the Si layer 13, a gate pattern is defined by resist patterning. Next, the resist pattern is transferred to the gate electrode pattern by dry etching. After this, impurities are injected into the Si layer 13 at a high concentration with using the dummy gate electrode 32 as a mask and a thermal activation step is performed to form a source region 21 and drain region 22. After this, the sidewall insulating films 26 are formed in self-alignment by deposition and dry etching of an insulating film. An interlayer insulating film 27 is finally deposited and the surface is flattened.

At this stage, the channel region is formed of Si. This is called a dummy channel region. Further, on the upper portion of the dummy channel region, a dummy gate insulating film 31 and dummy gate electrode 32 are formed. The source region 21 and drain region 22 are formed of Si doped with a high concentration.

A $Si_{1-x}Ge_x$ ($x<0.5$) layer can be epitaxially grown on the Si layer 13 before forming the dummy gate insulating film 31 and this can be used as the channel region. By forming the $Si_{1-x}Ge_x$ layer on the channel region, the following effect can be obtained.

(1) The hole mobility of SiGe is approximately twice higher than Si and it is effective as a high mobility channel material for a pMOS. If a SiGe layer is formed before formation of a dummy gate insulating film and the channel region of an nMOS is replaced by a III-V group in a channel-last process of this embodiment, the nMOS becomes a III-V channel and a pMOS becomes a SiGe channel. Therefore, it is unnecessary to perform a channel-last flow with respect to the pMOS and the fabrication cost can be lowered. In this case, the source/drain regions become SiGe layers in both of the nMOS and pMOS.

(2) It is preferable to set the composition ratio x of Ge in the $Si_{1-x}Ge_x$ layer to be not less than 0 and not larger than 0.5 and is desirable to set the same to 0.25 to 0.35, for example. With increasing x of $Si_{1-x}Ge_x$, the heat-resistance property of SiGe tends to be lowered while the hole mobility increases. When x exceeds 0.5, the source/drain regions cannot resist a high-temperature thermal load at approximately 1000° C. in the activation anneal step of the source/drain regions. In this embodiment, formation of a dummy gate stack by the gate-first process becomes impossible.

The composition ratio x=0.25 corresponds to the ratio at which three of four bonds of Si are connected with Si and the remaining one is connected with Ge. In this state, an advantage in enhancing the hole mobility by addition of Ge can be achieved while suppressing deterioration in the heat resistance. However, if an amount of Ge thermally diffused into the deep portion of the substrate during the high-temperature annealing is taken into consideration, x at approximately 0.25 to 0.35 is particularly preferable.

(3) When SiGe is used as a channel, the thickness d thereof is preferably set to 5 nm or more and 15 nm or less and, for example, it is preferably set to 7 nm. This is because the thickness of the inversion layer formed in the channel region in the ON state of the MISFET is set to approximately 15 nm to 5 nm depending on the gate bias. On the other hand, it is difficult to epitaxially grow an excessively thick SiGe layer.

(4) A high-quality channel can be formed when a III-V group is grown with using the edges of the source and drain regions as seeds. This is because, since the lattice constant is larger in SiGe than in Si, lattice mismatch between the seed portion and the channel region becomes small.

Figure 5C:
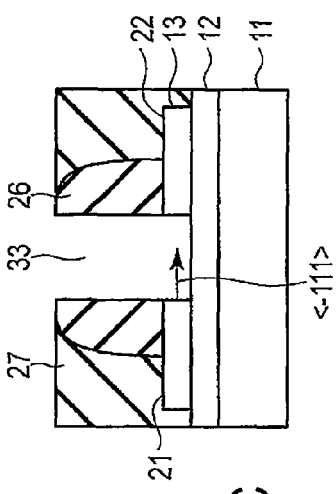

Next, as shown in FIG. 5C, the dummy gate electrode 32, dummy gate insulating film 31 and dummy channel region are removed with using the insulating films 26, 27 as a mask to form a groove portion 33. As a result, the (−111) plane and (1-1-1) plane are respectively exposed on the edge portion of the source region and the edge portion of the drain region.

After this, a step of flattening the {111} planes of the edge portions of the source and drain regions may be performed. The {111} planes are used as seeds for crystal growth of a III-V group by chemical vapor deposition of the next step. In order to form a III-V group channel of higher quality, it is preferable to form more flat {111} planes at the atomic level on the edge portions of the source and drain regions.

As the flattening step, one of the following two or both of them may be performed.

(i) One is an anisotropic wet-etching process in which the etching rate for the {111} plane is slower than for the other plane. Si wet-etching by using a tetramethylammonium hydroxide solution (TMAH) or a hydrazine hydrate solution ($H_2NNH_2 \cdot H_2O$) is anisotropic wet-etching in which the etching rate of the {111} plane is slow. It is possible to form a flat {111} plane at the atomic level due to preferential etching of micro roughness.

(ii) The other one is a high-temperature heat treatment in a $H_2$ atmosphere. In the heat treatment, an oxide on the Si surface is removed by a reduction action by $H_2$ to make easy surface diffusion of Si and micro roughness is eliminated by surface diffusion of Si activated by setting a high temperature. For example, a flat Si at the atomic level is obtained by a process of 1000° C. in a low-pressure $H_2$ atmosphere of 40 Torr for 3 min [see Document 5: R. Hiruta, Applied Surface, Science Vol. 237, p 63-67 (2004)]

Figure 5D:
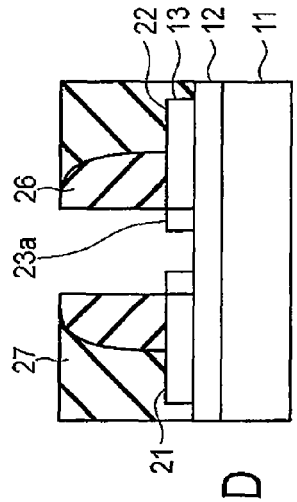
Figure 5E:
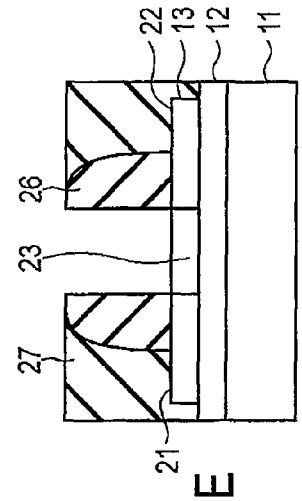

Next, as shown in FIGS. 5D, 5E, a channel region 23 of a III-V group semiconductor is formed between the source/drain regions 21, 22. Specifically, as shown in FIG. 5D, growth layers 23a formed of a III-V group material are grown selectively on the source edge portion formed of a (−111) plane and the drain edge portion formed of a (1-1-1) plane, respectively. Then, as shown in FIG. 5E, the channel region 23 is formed by connecting the left and right growth layers 23a. In this case, the lateral growth can be performed by selecting a chemical-vapor-deposition growth condition in which the III-V group grows with the preferential direction in a [111] direction.

The cross section perpendicular to the channel length direction of the thus formed channel region 23 tends to become a polygon having four or more corners formed of {110} crystal planes as shown in FIGS. 6A to 6C. Each case indicates a case where the channel length direction is <−111>. In FIGS. 6A to 6C, the front-rear direction of the sheet is the channel length direction.

In FIG. 6A, a hexagon with the cross section configured by (110), (101), (0-11), (−1-10), (−10-1), (01-1) planes is provided. In FIG. 6B, it is an octagon having a groove portion configured by (0-11), (−10-1) planes in addition to FIG. 6A. In FIG. 6C, it is a square (trapezoid) configured by (110), (01-1), (−1-10), (101) planes.

In the above examples, the {110} plane is a stable crystal plane with low surface energy as explained in (Basic Technique 1). The {110} planes of the side surface tend to become flat at the atomic level because of the low surface energy. As a result, the interface between the channel portion and the gate insulating film finally becomes flat at the atomic level. Since the frequency of roughness scattering for carriers traveling in the surface inversion layer in the channel length direction is lowered as the degree of flatness of the channel/gate insulating film interface becomes higher, the current drive of MISFET increases. Therefore, the channel shape shown in FIG. 6A contributes to an improvement in the device performance.

In addition, in the case of FIG. 6B, the groove portion D does not degrade the current drive of MISFET. This is because the groove portion D configured by the (0-11) and (−10-1) planes is formed along the channel length direction and it does not induce roughness scattering.

Further, as the III-V group material, one of GaP, AlP, GaAs, AlAs, InP, InAs, GaSb, AlSb, InSb, InGaAs and InGaNAs can be adequately selected.

Figure 5F:
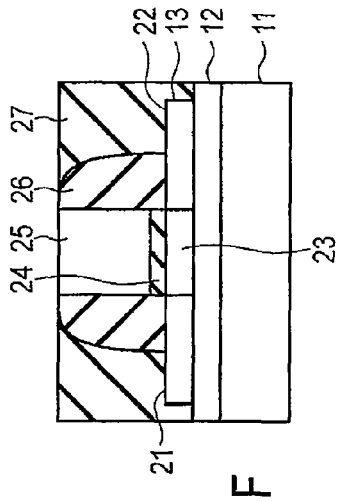

Next, as shown in FIG. 5F, the structure shown in FIG. 4 is completed by forming a gate insulating film 24 and gate electrode 25.

As the gate insulating film 24, one of $Al_2O_3$, $HfO_2$, $La_2O_3$, $Ta_2O_5$, LaAlO, LaAlSiO, HfSiO, HfSiON, HfLaSiON, HfAlSiON, HfTaSiON and HfLaAlSiON can be adequately selected. As a deposition method of the gate insulating film 24, an MOCVD, ALD, sputtering and a combination thereof can be selected. After formation of the gate insulating film 24, nitrogen may be introduced by plasma nitridation.

As the gate electrode 25, one of TiN, Al, TiAl, TiAlN, HfSi, HfC, HfCN, TaC, TaN, W, WN, Mo, MoN can be adequately selected. As a deposition method of the gate electrode 25, an MOCVD, ALD, sputtering and a combination thereof can be selected. Further, the metal filling ratio in the concave portion can be improved by heat treatment at an adequate temperature after deposition.

Figure 7A:
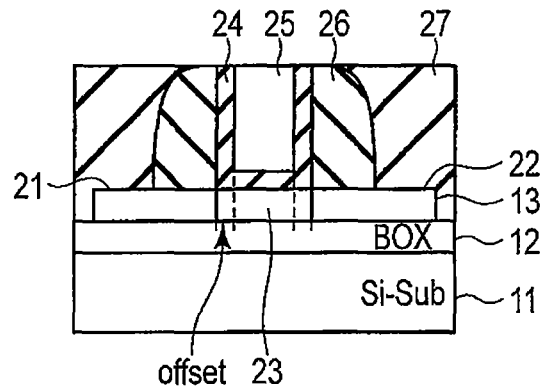
FIGS. 7A to 7C are cross-sectional views indicating a modification of the first embodiment and showing an example of avoiding an offset region.

When the gate insulating film 24 is deposited in the step of FIG. 5F, the gate insulating film 24 is also deposited on the side surfaces of the groove portion. Therefore, as shown in FIG. 7A, offset regions that are not controlled by the gate electrode 25 may be formed in some cases near both ends of the channel region 23.

Figure 7B:
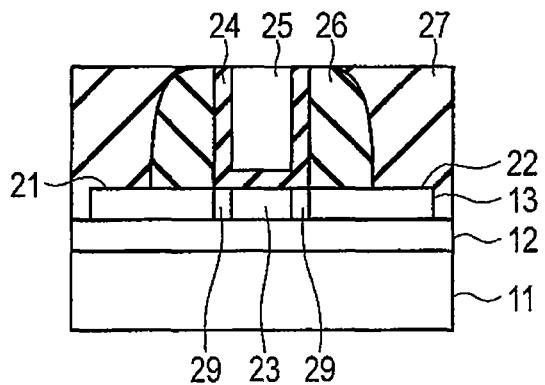

In order to avoid this, it is effective to grow in-situ doped Si or in-situ doped III-V group by approximately the thickness of the gate insulating film 24 prior to the chemical-vapor-deposition growth step of a III-V group material in FIGS. 5D, 5E. The in-situ doped Si or in-situ doped III-V group functions as a part of the source or drain. This state is shown in FIG. 7B. 29 in the drawing is an in-situ doped Si layer.

Figure 7C:
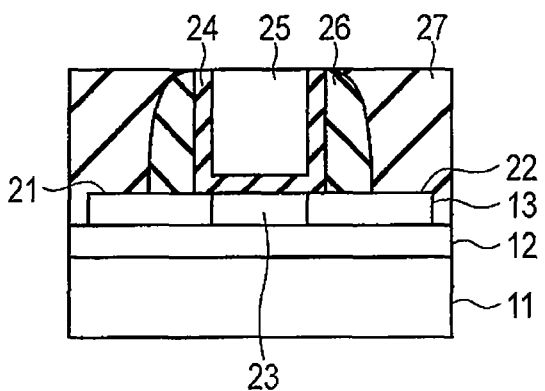

Further, as another method, it is effective to etch back the sidewalls by approximately the thickness of the gate insulating film 24 by wet-etching or the like prior to the chemical-vapor-deposition growth step of a III-V group material in FIGS. 5D, 5E. This state is shown in FIG. 7C. Since the sidewall insulating film 26 is etched back, offset can be avoided even if the gate insulating films 24 are formed on the side surfaces of the sidewall insulating film 26.

When a III-V group material is grown in the steps of FIGS. 5D, 5E, the undersurface of the grown III-V group structure contacts a BOX layer, but the upper surface thereof is not so formed. Due to this, the growth rates in the upper portion and lower portion of the III-V group might be different and the uniformity might be degraded. In order to avoid this, it is effective to etch the BOX layer to an adequate extent prior to the growth of a III-V group. This state is shown in FIGS. 8A, 8B.

As shown in FIG. 8A, an exposed portion of the buried insulating layer 12 is etched by a preset amount to form a BOX dig region 34 in the step of FIG. 5C. After this, as shown in FIG. 8B, a channel region 23 formed of a III-V group semiconductor is selectively grown. In this case, in the process of growth of the III-V group, the upper surface and undersurface of the III-V group structure are in similar situation, which can be expected to enhance the uniformity.

Thus, in this embodiment, a MISFET including source-drain regions formed of Si whose crystal orientation in a direction perpendicular to the substrate surface is <110> and a channel region formed of a III-V group whose channel length direction is <–111> is explained. The MISFET is formed by the step of removing the dummy channel region and the step of laterally growing a III-V group while the (–111) plane and (1-1-1) plane respectively appearing on the source edge and drain edge are used as seed portions. As the effect of the structure and method, a high-mobility channel material MISFET using a III-V group semiconductor in the channel region can be formed on the Si substrate with high density and high quality. Next, the effect is more specifically explained in comparison with the known example.

The (Document 2) discloses the structure in which the III-V group material is used in the channel region and SiGe is used in the source/drain regions. Further, the (Document 3) discloses the structure in which the semiconductor material having a wider energy band gap than Si is used in the channel region and Si containing impurities is used in the source/drain regions. However, neither of (Documents 2, 3) refers to the crystal orientation definition of the source/drain regions. In contrast, in the structure (FIG. 4) of this embodiment, the crystal orientations of the source/drain regions and the channel are difined. The crystal orientation perpendicular to the substrate surface of the source/drain regions is <110>, the vertical direction to the interface between the source region and the channel region is <–111> and the vertical direction to the interface between the drain region and the channel region is <1-1-1>.

The crystal orientation definition plays an important role when a high-quality III-V group channel portion is formed. That is, when the crystal plane orientation is defined according to this embodiment, the edge portions of the source/drain regions corresponding to both side surfaces of the concave portion exposed after removing the dummy channel are both set to {111} planes. In this embodiment, a III-V group is epitaxially grown selectively from the both ends with using Si {111} of the edge portions of the source/drain regions as seed portions. And the channel region is formed by filling the concave portion with the III-V group. The thus formed III-V channel portion has preferable features in device characteristics such as high crystallinity, high degree of crystal orientation, high degree of flatness and extremely steep interface between channel and source/drain.

When the other crystal plane orientation is selected, the [111] direction that is the preferential growth direction of III-V does not coincide with the channel length direction. Therefore, it becomes difficult to form a channel portion with a high degree of orientation and high degree of flatness. Further, the {111} plane is the most preferable plane as a seed portion when epitaxially growing a III-V group of high quality. Since the edge portions of the source/drain regions do not become {111} planes when crystal orientation different from this embodiment is selected, high crystallinity cannot be realized.

Additionally, by setting the crystal orientation according to this embodiment, the current drive of MISFET can be increased by two factors; (1) an increase in the rate of carrier injection from the source region into the channel region, and (2) a reduction in the resistance of the drain region, the source region and the source/channel interface. As shown in FIG. 9, this is because the conduction mass of electrons in the direction is smaller than that in the other [111] direction within the Si (110) plane. In the case of the high-mobility channel material MISFET, since the resistance of the channel portion itself is relatively small, the enhancement of the carrier injection rate and the reduction of parasitic resistance are particularly important.

Further, since the resistance of the channel portion becomes lower as the gate length (Lg) becomes finer, the drive current tends to be more influenced by the parasitic resistance and the carrier injection rate. The influences become significant when Lg is set to 150 nm or less and become particularly significant in the case of 50 nm or less. Therefore, setting the crystal orientation according to this embodiment is particularly effective with respect to a high-mobility channel material MISFET with Lg of 150 nm or less and the effect is further increased when Lg is set to 50 nm or less.

The crystal orientations of the source region, the drain region and the interfaces of the channel region with them can be clarified by cutting out the corresponding portion from the MISFET by a pickup method by FIB (Focused Ion Beam) and photographing the cross section by use of a high resolution transmission electron microscope (HRTEM) or analyzing by use of a transmission electron diffraction method (Transmission Electron Diffraction: TED).

Both of the formation methods of the (Document 1) and this embodiment include III-V group crystal growth with using the Si {111} plane as a seed portion. Since the (Document 1) utilizes lateral growth with using the Si (111) plane of the $SiO_2$ opening portion as a seed portion, the area penalty corresponding to the seed portion is inevitable. In contrast, in the formation method of this embodiment, since the source edge portion formed of the (–111) plane and the drain edge portion formed of the (1-1-1) plane function as seed portions, the additional area penalty does not exist. As a result, the high-quality crystal growth of a high-mobility channel material can be realized with using the Si {111} as the seed portion without an area penalty.

In the formation method (FIGS. 5A to 5F) of this embodiment, the gate-stack structure of a channel region, gate insulating film and gate electrode is formed after high-temperature activation annealing of the source/drain regions. This is called a channel-last (Channel-last) process. A high-temperature thermal load to the gate stack structure considerably degrades the characteristics of both of the interfaces of the high-mobility material channel/gate insulating film and the gate insulating film/gate electrode. However, this can be avoided by using the channel-last-process.

On the other hand, the formation method of the (Document 1) is the channel-first (Channel-first) process and cannot avoid the high-temperature thermal load to the gate stack structure. Further, the (Document 3) uses the channel-last-process like the formation method of the first embodiment, but the crystal orientation definition is not provided and the Si {111} plane cannot be used as the seed portion. Therefore, high-quality crystal growth of the high-mobility channel material becomes impossible.

That is, the formation method of this embodiment makes it possible by specifying crystal orientation to form a channel region of a high-mobility material by high-quality crystal growth using Si {111} as a seed portion, without an area penalty, via the channel-last-process in which the high-temperature thermal load can be avoided.

(Second Embodiment)

In a second embodiment, a MISFET with the same structure as in the first embodiment except that the channel region 23 is formed of Ge is formed by the same formation method as in the first embodiment except the formation method of the Ge channel region. That is, a MISFET includes source/drain regions 21, 22 formed of Si whose crystal orientation in the vertical direction to the substrate surface is <110> and a channel region 23 formed of Ge whose channel length direction is <−111>. The MISFET is formed by a step of removing a dummy channel region to expose edge portions of the source/drain regions and a step of laterally growing Ge with using (−111) and (1-1-1) planes of the source/drain edges as seed portions.

Ge has hole mobility approximately four times higher than that of Si and is particularly desirable as a high-mobility channel material for p-type MISFET. However, there is a problem that the interfaces between the Ge channel region and the source/drain regions and the interface between the Ge channel region and the gate insulating film are weak with respect to a high-temperature thermal load.

In this embodiment, the high-temperature thermal load can be avoided because of the channel-last-process. Additionally, high-quality crystal growth of Ge can be performed with using Si {111} as a seed portion without an area penalty. Therefore, according to this embodiment, a Ge-channel MISFET can be formed on a Si substrate with high density and high quality.

(Third Embodiment)

FIG. 10 is a cross-sectional view showing the structure of a MISFET according to the third embodiment, and particularly, shows the cross section in a channel length direction. In this case, 41, 51 to 57 in FIG. 10 correspond to 11, 21 to 27 in FIG. 4.

This embodiment is different from the first embodiment explained before in that a bulk substrate is used instead of the SOI substrate.

Device isolation is realized by STI (Shallow trench isolation) 45 to form a MISFET on a Si substrate 41. A source region 51 and drain region 52 are formed of Si and the crystal orientation in the vertical direction to the substrate surface thereof becomes <110>. A channel region 53 sandwiched by the source/drain regions 51, 52 is formed of a III-V group material. The direction perpendicular to the interface between the source region 51 and the channel region 53 is <−111> and the direction perpendicular to the interface between the drain region 52 and the channel region 53 is <1-1-1>. Sidewall insulating films 56 are formed on the side surfaces of a gate stack formed by combining the gate insulating film 54 with the gate electrode 55. Further, the MISFET is covered with an interlayer insulating film 57.

FIGS. 11A to 11F are cross-sectional views showing fabrication steps of the MISFET of FIG. 10. It is formed by basically the same steps as in FIGS. 5A to 5F explained in the first embodiment although the substrate is different.

Figure 11A:
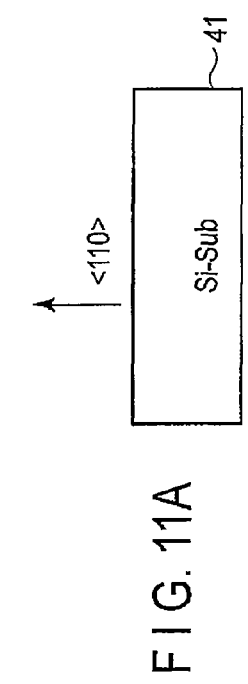
FIGS. 11A to 11F are cross-sectional views showing fabrication steps of the MISFET according to the third embodiment.

First, as shown in FIG. 11A, a Si substrate 41 whose upper surface is a (110) plane is prepared.

Figure 11B:
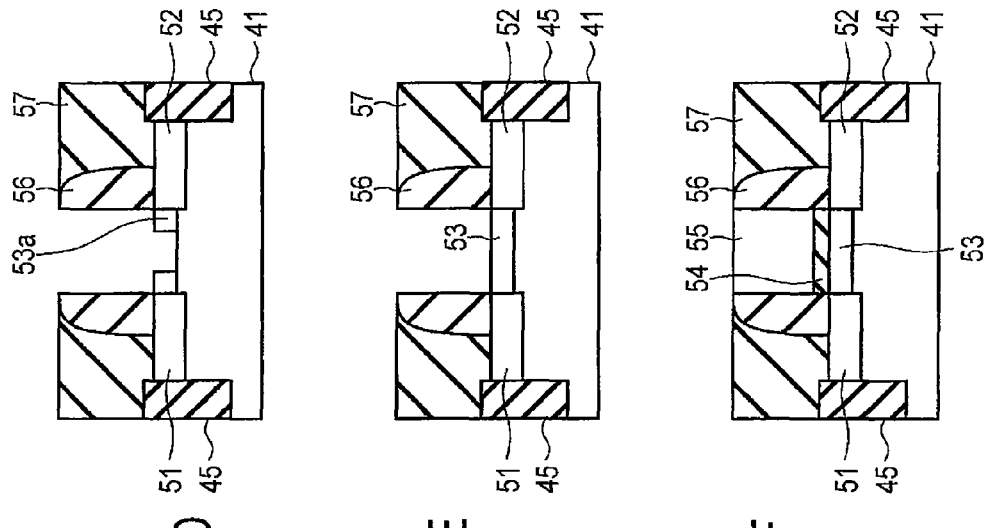

Next, as shown in FIG. 11B, after performing device isolation by STI 45, a MISFET is formed by a conventional gate-first-process with the channel length direction set to an orientation of <−111>. Specifically, like the first embodiment, after a dummy gate insulating film 61 and dummy gate electrode 62 are formed in a gate pattern, impurities are injected at a high concentration to form a source region 51 and drain region 52 and then sidewall insulating films 56 and interlayer insulating film 57 are deposited.

At this stage, a dummy channel region is formed of Si. Further, above the dummy channel region, the dummy gate insulating film 61 and dummy gate electrode 62 are formed. The source region 51 and drain region 52 are formed of Si doped at a high concentration.

Figure 11C:
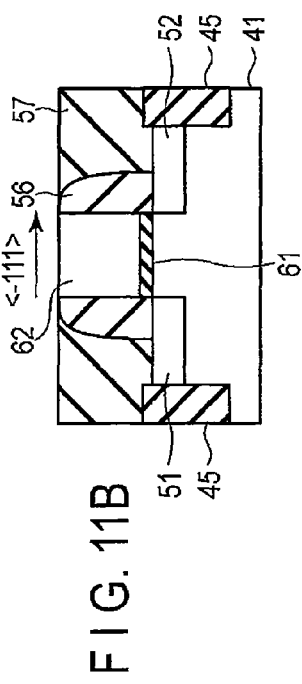

Next, as shown in FIG. 11C, after the dummy gate electrode 62 and dummy gate insulating film 61 are removed, Si of the channel portion is etched to an adequate extent. For example, the depth of the etched portion is set to 5 nm or more and 15 nm or less. This depth corresponds to the thickness of the inversion layer formed in the channel region in the ON state of the MISFET. As a result, (−111) plane and (1-1-1) plane are respectively exposed on the side surfaces of the source and drain edges. Further, the bottom surface of the etched portion is formed of a (110) plane.

Figure 11D:
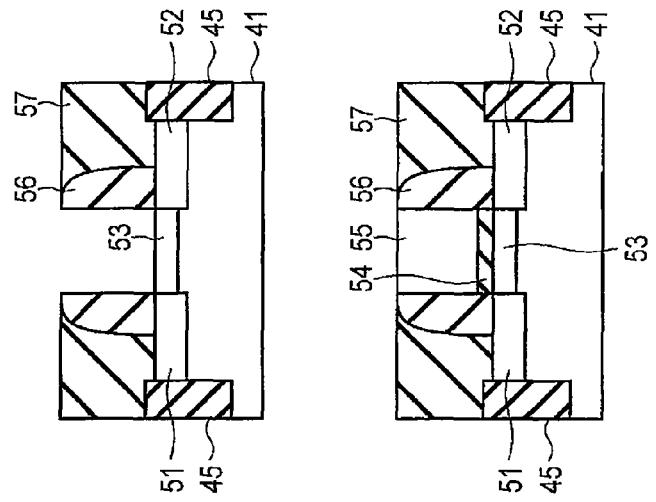
Figure 11E:
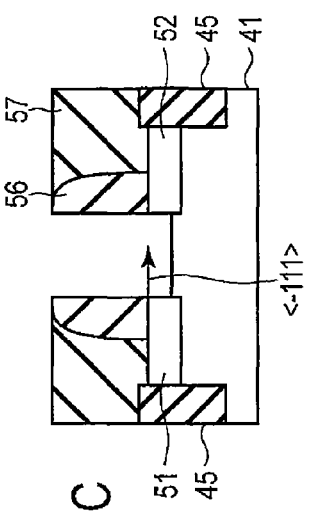

Next, as shown in FIGS. 11D, 11E, like the first embodiment, a channel region 53 is formed by selective growth of a III-V group material on the source edge formed of the (−111) plane and the drain edge formed of the (1-1-1) plane. The lateral growth can be realized by selecting a chemical-vapor-deposition growth condition in which the III-V group preferentially grows in a [111] direction.

Figure 11F:
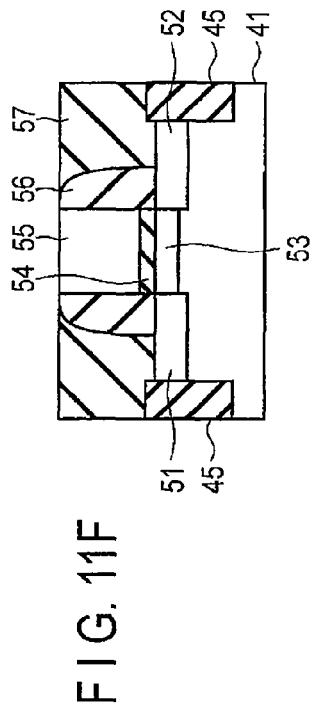

Next, as shown in FIG. 11F, like the first embodiment, a gate insulating film 54 and gate electrode 55 are formed.

Thus, in this embodiment, like the first embodiment, the high-mobility channel material MISFET can be formed with a high density on the Si substrate by using the bulk substrate. Additionally, since a bulk Si substrate that is inexpensive compared to an SOI substrate may be used, the fabrication cost can be reduced.

(Fourth Embodiment)

FIG. 12 is a perspective view showing the device structure of a Fin-type MISFET according to the fourth embodiment. In this case, 71 to 73, 81 to 87 in FIG. 12 correspond to 11 to 13, 21 to 27 in FIG. 4.

In this embodiment, an SOI substrate having a buried insulating layer (BOX) 72 formed on a Si substrate 71 and a Si layer (SOI layer) 73 formed thereon is used as a supporting substrate. Then, a Fin-type MISFET having a source region 81, drain region 82, and a channel region 83, which are formed by processing the Si layer 73 of the SOI substrate into a thin-wall shape, and additionally, gate insulating film 84 and gate electrode 85 is formed.

The source region 81 and drain region 82 are formed of Si and the crystal orientation of a perpendicular direction to the substrate surfaces thereof is <110>. The channel region 83 sandwiched between the source and drain regions 81, 82 is formed of a III-V group material. The direction perpendicular to the interface between the source region 81 and the channel region 83 is <−111> and the direction perpendicular to the interface between the drain region 82 and the channel region 83 is <1-1-1>. The surrounding portion of the channel region 83 is covered with the gate insulating film 84 and the outer peripheral portion thereof is covered with the gate electrode 85. Sidewall insulating films 86 are formed on the side surfaces of the gate stack formed of a combination of the gate insulating film 84 and gate electrode 85. Further, the Fin-type MISFET is covered with an interlayer insulating film 87.

Next, a fabrication method of the Fin-type FET of this embodiment is explained with reference to FIGS. 13A to 13C.

First, as shown in FIG. 13A, a substrate having an SOI layer whose upper surface is a (110) plane is prepared and an Fin-type MISFET is formed in which the channel length direction is set to an orientation of <−111> by a conventional gate-first-process. At this stage, a channel region is formed of Si. This is called a dummy channel region. Further, on the upper portion of the dummy channel region, a dummy gate insulating film 91 and dummy gate electrode 92 are formed. A source region 81 and drain region 82 are formed of Si doped with a high concentration.

Next, as shown in FIG. 13B, after sidewall insulating films 86 and interlayer insulating film 87 (not shown) are formed, the dummy gate electrode 92, dummy gate insulating film 91 and dummy channel region are removed with using the above insulating films as a mask. As a result, (−111) plane and (1-1-1) plane are respectively exposed on the edge portion of the source region 81 and the edge portion of the drain region 82.

Next, as shown in FIG. 13C, a channel region 83 is formed by selective growth of a III-V group material on the source edge formed of the (−111) plane and the drain edge formed of the (1-1-1) plane. The lateral growth can be realized by selecting a chemical-vapor-deposition growth condition in which the III-V group preferentially grows in a [111] direction. After this, the structure shown in FIG. 12 is obtained by forming a gate insulating film 84 and gate electrode 85.

In FIG. 13C, the III-V group channel region is formed in a rectangular form, but may be formed in a hexagonal column form like FIG. 1. The scope of this embodiment includes this case.

Further, the scope of this embodiment includes a gate all-around type MISFET.

A step of etching a BOX-SiO$_2$ layer 72 by a preset amount is performed following the removing step of the dummy channel region of FIG. 13B. For example, the buried insulating film 72 is etched by approximately 20 to 30 nm. After the III-V group crystal growth of FIG. 13C, a high-k insulating film and metal gate are formed by a MOCVD or ALD method. For example, HfSiO is formed by the MOCVD and then N is introduced by plasma nitridation to form HfSiON of 3 nm. After this, TiN, HfC or TaC of approximately 7 nm is formed by the CVD method. Finally, Al or TiAl is deposited on the gate electrode portion and heat treatment of approximately 550° C. is performed. By performing the heat treatment, Al or TiAl is melted to enhance the space-filling rate.

By the above steps, as shown in FIG. 14, a gate all-around type MISFET in which the cross section perpendicular to the channel length direction is a hexagonal shape and the gate electrode 85 is formed on the entire peripheral surface of the channel region 83 via the gate insulating film 84 can be formed.

Since the gate all-around type MISFET has the structure in which the entire surface of a wire-shaped channel is covered with the gate insulating film and gate electrode, it has a feature that the controllability of the gate electrode to control the electron state of the channel is extremely strong and it is highly resistant to the short-channel effect.

Thus, the gate all-around type high-mobility channel material MISFET whose short-channel effect resistance is enhanced can be formed with the preferable features as regards device characteristics of (1) the crystallinity and the degree of crystal orientation of the channel portion are high and (2) the degree of flatness of the channel/insulating film interface is high. Therefore, according to this embodiment, the Fin-type high-mobility channel material MISFET whose short-channel effect resistance is enhanced or the gate all-around type high-mobility channel material MISFET whose short-channel effect resistance is further enhanced can be formed with high packing density on the Si substrate.

In this embodiment, the SOI substrate is used, but a Fin-type MISFET or gate all-around type MISFET may be formed on a bulk Si substrate.

(Modification)

As described above, the embodiments of this invention are explained with reference to the concrete examples. However, this invention is not limited to the above concrete examples. That is, something that can be obtained by adequately changing the design of the concrete examples by those skilled in the art is contained in the scope of this invention provided it has the features of this invention. For example, the respective elements of the concrete examples described before, and the arrangement, material, condition, shape, size and the like thereof are not limited to those shown in the examples and can be adequately changed.

Further, the concrete examples described before can be combined if it is technically possible and something obtained by combining them is contained in the scope of this invention provided it has the features of this invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
source/drain regions formed on a surface of a supporting substrate, the source/drain regions being formed of Si1-xGex (x <0.5) with a crystal orientation perpendicular to the surface set to a [110] direction and separately formed in a [111] direction perpendicular to the [110] direction and a plane orientation of a side surface in a channel length direction being oriented to the [111] perpendicular to the [110] direction,
a channel region formed between the source/drain regions, the channel region being formed of a III-V group semiconductor or Ge, and
a gate electrode formed above the channel region via a gate insulating film.

2. The device of claim 1,
a cross section perpendicular to the channel length direction of the channel region is a polygonal shape formed of {110} crystal planes.

3. The device of claim 1,
a length of the channel region in the channel length direction is 150 nm or less.

* * * * *